United States Patent
Tortai et al.

(10) Patent No.: US 9,934,336 B2
(45) Date of Patent: Apr. 3, 2018

(54) METHOD OF CORRECTING ELECTRON PROXIMITY EFFECTS USING VOIGT TYPE SCATTERING FUNCTIONS

(71) Applicant: ASELTA NANOGRAPHICS, Grenoble (FR)

(72) Inventors: Jean-Herve Tortai, Grenoble (FR); Patrick Schiavone, Villard-Bonnot (FR); Thiago Figueiro, Grenoble (FR); Nader Jedidi, Grenoble (FR)

(73) Assignee: Aselta Nanographics, Grenoble (FR)

( * ) Notice: Subject to any disclaimer, the term of this patent is extended or adjusted under 35 U.S.C. 154(b) by 0 days.

(21) Appl. No.: 13/861,284

(22) Filed: Apr. 11, 2013

(65) Prior Publication Data
US 2013/0275098 A1 Oct. 17, 2013

(30) Foreign Application Priority Data
Apr. 12, 2012 (FR) ...................... 12 53389

(51) Int. Cl.
*G06F 17/10* (2006.01)
*G06F 17/50* (2006.01)
(Continued)

(52) U.S. Cl.
CPC .......... *G06F 17/5009* (2013.01); *B82Y 10/00* (2013.01); *B82Y 40/00* (2013.01);
(Continued)

(58) Field of Classification Search
CPC ................................. G06F 17/5009
(Continued)

(56) References Cited

U.S. PATENT DOCUMENTS

2007/0021938 A1* 1/2007 Ogino .......................... 702/117
2008/0067446 A1* 3/2008 Belic et al. .............. 250/492.22
(Continued)

FOREIGN PATENT DOCUMENTS

FR 2979165 A1 2/2013
JP 2001-083109 A 3/2001
(Continued)

OTHER PUBLICATIONS

"Peak Shape Functions," Jan. 25, 2009, Wayback Machine archive of http://pd.chem.ucl.ac.uk/pdnn/peaks/others.htm, two pages.*
(Continued)

*Primary Examiner* — Kamini S Shah
*Assistant Examiner* — Russ Guill
(74) *Attorney, Agent, or Firm* — Baker Hostetler LLP

(57) ABSTRACT

A method for projecting an electron beam used notably in lithography by direct or indirect writing as well as in electron microscopy, is provided. Notably for critical dimensions or resolutions of less than 50 nm, the proximity effects created by the forward and backward scattering of the electrons of the beam in interaction with the target must be corrected. This is traditionally done using the convolution of a point spread function with the geometry of the target. In the prior art, said point spread function uses Gaussian distribution laws. At least one of the components of the point spread function is a linear combination of Voigt functions and/or of functions approximating Voigt functions, such as the Pearson VII functions. In certain embodiments, some of the functions are centered on the backward scattering peaks of the radiation.

14 Claims, 7 Drawing Sheets

(51) Int. Cl.
  *H01J 37/22* (2006.01)
  *H01J 37/317* (2006.01)
  *G03F 7/20* (2006.01)
  *B82Y 10/00* (2011.01)
  *B82Y 40/00* (2011.01)

(52) U.S. Cl.
  CPC .......... *G03F 7/2059* (2013.01); *H01J 37/222* (2013.01); *H01J 37/3174* (2013.01); *H01J 2237/226* (2013.01); *H01J 2237/31769* (2013.01)

(58) Field of Classification Search
  USPC .......................................................... 703/2
  See application file for complete search history.

(56) References Cited

U.S. PATENT DOCUMENTS

| | | | |
|---|---|---|---|
| 2009/0162789 A1* | 6/2009 | Pain et al. | 430/296 |
| 2011/0226970 A1* | 9/2011 | Krecinic et al. | 250/492.22 |
| 2012/0314198 A1* | 12/2012 | Lee et al. | 355/77 |
| 2013/0043389 A1 | 2/2013 | Schiavone et al. | |
| 2013/0201468 A1* | 8/2013 | Manakli | 355/77 |
| 2013/0239071 A1* | 9/2013 | Chang et al. | 716/53 |

FOREIGN PATENT DOCUMENTS

| | | |
|---|---|---|
| JP | 2002-075818 A | 3/2002 |
| JP | 2006-222230 A | 8/2006 |
| TW | 201248755 A | 12/2012 |
| WO | 2012/084091 A1 | 6/2012 |

OTHER PUBLICATIONS

Paul J.M. van Adrichem et al., "Data Preparation," 2005, in "Handbook of Photomask Manufacturing Technology," Taylor & Francis, 25 pages.*
"Peak Fitting Module," 2002, OriginLab Corporation, 124 pages.*
Fumihiro Koba et al., "Highly accurate proximity effect correction for 100kV electron projection lithography," 2005, Japanese Journal of Applied Physics, vol. 44, No. 7B, pp. 5590-5594.*
A.S. Kirov, et al., "Towards Two-Dimensional Brachytherapy Dosimetry Using Plastic Scintillator: Localization of the Scintillation Process", Nuclear Instruments and Methods in Physics Research Section A: Accelerators, Spectrometers, Detectors, and Associated Equipment, Jan. 1, 2000, pp. 178-188, vol. 439, No. 1, Elsevier Science B.V., Netherlands, XP004253721.
Dominique Drouin, et al., "Casino V2.42—A Fast and Easy-to-use Modeling Tool for Scanning Electron Microscopy and Microanalysis Users", Scanning vol. 29, 92-101 (2007). Wiley Periodicals, Inc.
Office Action in Japanese Patent Application No. 2013-082602, dated Dec. 6, 2016.
Search Report in Taiwanese Patent Application No. 102110701, dated Oct. 5, 2016.
D.C.W. Sanderson, "Thick Source Beta Counting (TSBC): A Rapid Method for Measuring Beta Dose-Rates," Nucl. Tracks Radiat. Meas., vol. 14, Nos. 1/2, 1988, pp. 203-207.

* cited by examiner

METHOD OF CORRECTING ELECTRON PROXIMITY EFFECTS USING VOIGT TYPE SCATTERING FUNCTIONS

CROSS-REFERENCE TO RELATED APPLICATION

This application claims priority to foreign French patent application No. FR 1253389, filed on Apr. 12, 2012, the disclosure of which is incorporated by reference in its entirety.

FIELD OF THE INVENTION

The present invention applies notably to the field of electron lithography for direct on-wafer etching or for fabricating masks. More generally, it applies to any field where it is required to model the interaction of a beam of electrons with a target, this also being the case in electron microscopy, notably for the inspection of wafers and masks.

BACKGROUND

This interaction is notably affected by a scattering of the electrons around the initial trajectory (forward scattering effect) as well as by a backscattering (backward scattering effect). These effects, referred to as proximity effects, depend notably on the materials of the target and its geometry. Whatever the reason for desiring to perform this electron bombardment (etching, imaging or analysis), it is therefore necessary to take account of the proximity effects in order to obtain a result which is faithful to the objective sought. A correction of the proximity effects is therefore performed. Accordingly, it is known to predict them through a model so as to take account thereof in the calculation of the electron radiation doses used to bombard the target. It is accordingly known to use a so-called point spread or scattering function (or PSF) and the PSF is convolved with the geometry of the target. A commonly used PSF is a combination of Gaussians, a first Gaussian to model forward scattering (PSF of the forward scattering), and one or more additional Gaussians to model the backscattering (PSF of the backscattering).

The equation of the PSF is thus traditionally represented by a function f(x,y) of the following form:

$$f(\xi) = \frac{1}{\pi(1+\eta)} \left( \frac{1}{\alpha^2} e^{\frac{-\xi^2}{\alpha^2}} + \frac{\eta}{\beta^2} e^{\frac{-\xi^2}{\beta^2}} \right)$$

With the following notation:
- $\alpha$ is the width of the direct radiation;
- $\beta$ is the backscattering width;
- $\eta$ is the ratio of the intensities of the direct and backscattered radiations.
- $\xi$ is the radial position of a point The values of the parameters $\alpha$, $\beta$ and $\eta$ can be determined experimentally for a given method. These parameters are dependent on the acceleration voltage of the machine and the target. Typically for an acceleration voltage of the order of 50 KV and a silicon or glass target ($SiO_2$), $\alpha$ is of the order of 30 nm, $\beta$ of the order of 10 μm and $\eta$ of the order of 0.5.

However, if the energy distribution around the impact point, given by a PSF of this double Gaussian type, is compared with that produced by a simulation using a Monte-Carlo model, significant deviations are noted. The simulations of Monte-Carlo type, referred to in the subsequent description as the reference model, are closer to the experimental results but are difficult to use in production because of the long calculation times necessary for the simulation. An indicator of the quality of a model will therefore be the "fit" between the PSF used and the reference model, the fit being measured by the sum of the quadratic deviations between the two curves representing the two models on a normalized sample size of points.

It appears particularly useful to find forms of a PSF that are closer to the simulation results and experimental results but that can be parametrized and therefore calculated in a much shorter time than Monte-Carlo simulations.

SUMMARY OF THE INVENTION

The present invention solves the problem posed by the deviations of modeling of the proximity effects by using a class of PSF combining Lorentzian functions with Gaussian functions, for example a Voigt function, or approximations of these functions.

For this purpose, the invention envisages a method for projecting an electron beam onto a wafer or a mask comprising a step of correcting the effects of scattering of said beam, said step comprising a sub-step of calculating a point spread function, wherein said point spread function is a linear combination of functions chosen from a group comprising at least one Voigt function (230) and a function approximating a Voigt function.

Advantageously, said at least one function approximating a Voigt function is a Pearson VII function.

Advantageously, said linear combination of functions also comprises at least one Gaussian function.

Advantageously, the sub-step of calculating a point spread function comprises a sub-step of selection of the parameters of said functions which are included in the linear combination and of the coefficients of said linear combination, said selection sub-step comprising an execution of an optimization function of the fit of the point spread function with a set of experimental results or with a representation of a Monte-Carlo simulation of the scattering of the radiation on the target.

Advantageously, said at least one function has an extremum which is not located at the center of the beam.

Advantageously, said at least one function has an extremum which is located on a backward scattering peak of the electron beam.

Advantageously, said point spread function is a linear combination of at least as many functions as the radiation comprises backward scattering peaks.

To implement the method, the invention also envisages a computer program comprising program code instructions configured for the execution of a method for projecting an electron beam on a wafer or a mask of claim 1 when the program is executed on a computer, said program comprising a module for simulating and/or correcting the scattering effects in said beam, said module comprising a sub-module for calculating a point spread function, wherein said point spread function is a linear combination of functions chosen from a group comprising at least one Voigt function and a function approximating a Voigt function.

The invention also covers an electron lithography system comprising a module for projecting an electron beam onto a wafer or a mask and a computer program having the characteristics defined hereinabove.

The invention also covers a system for simulating at least one electron lithography step comprising a module for simulating a step of projecting an electron beam onto a wafer or a mask and a computer program having the characteristics defined hereinabove.

The invention also covers an electron microscopy system comprising a module for projecting an electron beam onto a wafer or a mask and a computer program having the characteristics defined hereinabove.

In one embodiment of the invention in which use is made of a PSF comprising a function having four Voigt functions, it has been possible to demonstrate a very significant improvement in the residual mean square error which is 88% lower than that noted with four Gaussians.

Furthermore, the classes of function used in this embodiment have an analytical expression and they can easily be integrated into off-the-shelf tools without significant modification. The cumulative distribution function being analytical itself, the convolution calculations which are necessary for the correction of the proximity effects remain of the same order of computational complexity as the solutions of the prior art.

BRIEF DESCRIPTION OF THE DRAWINGS

The invention will be better understood, its various characteristics and advantages will emerge from the description which follows of several exemplary embodiments and its appended figures wherein.

DETAILED DESCRIPTION

Figure 1:
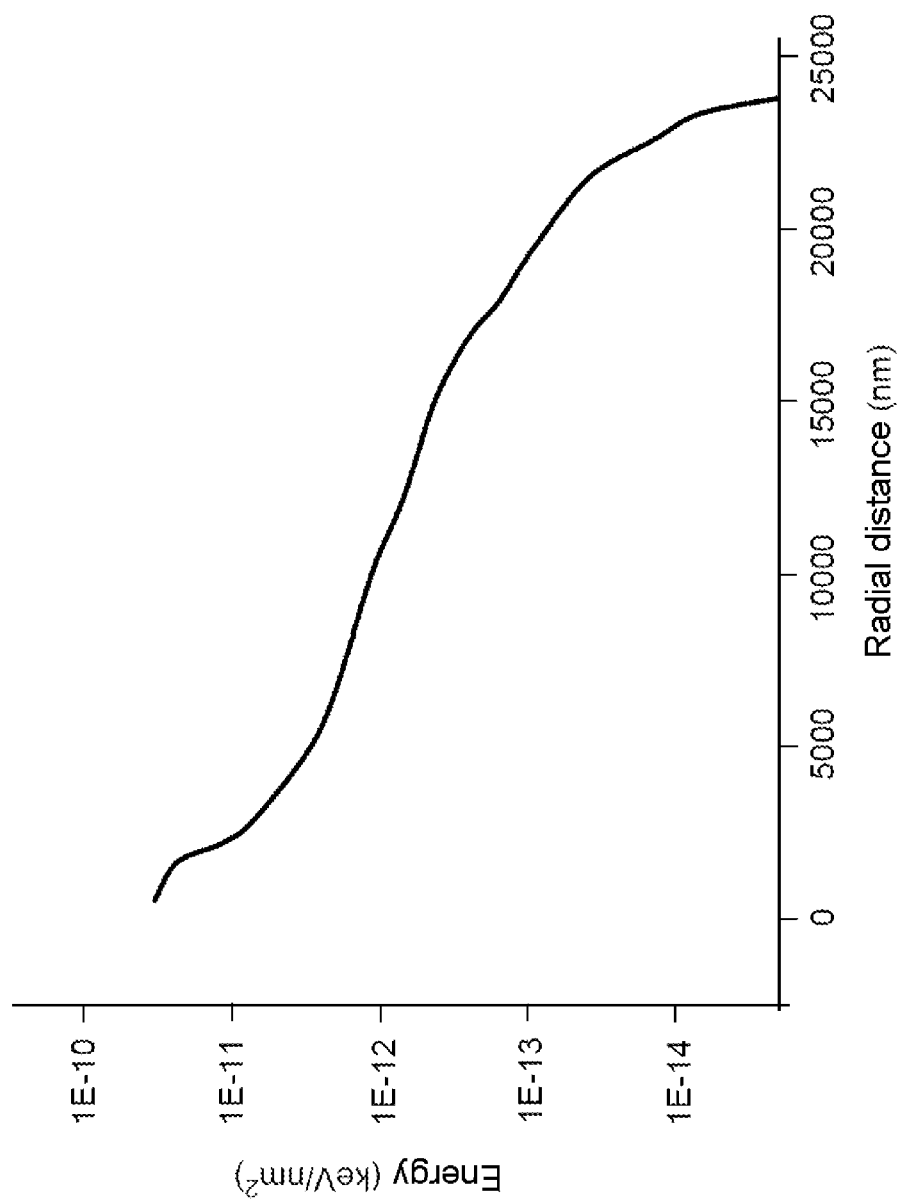
FIG. 1 represents the distribution of energy absorbed by a resin according to a reference model.

FIG. 1 represents the distribution of energy absorbed by a resin according to a reference model.

The publication CASINO V2.42 ("A Fast and Easy-to-use Modeling Tool for Scanning Electron Microscopy and Microanalysis Users", Scanning, vol. 29, 92-101 (2007), D. Drouin et al) sets forth the operation of software for simulating the energy distribution of an electron beam by the Monte-Carlo procedure. The software makes it possible to best describe how the energy is distributed around the center of the beam of electrons by choosing the parameters of various possible physical models of interaction between the electrons and the target of the beam, nature of the materials and thicknesses of the layers mainly.

In the example of the figure, one can see the distribution of energy absorbed in 100 nm of PMMA (polymethyl methacrylate) deposited on a quartz substrate as a function of the radial distance of a 50 keV ($10^6$ electrons) beam, the representation being on a double logarithmic scale (log (keV/nm2) as ordinate and log (nm) as abscissa). It is observed that this distribution does not exhibit any horizontal plateaus, plateaus necessarily being present when using Gaussian functions to describe this distribution. Thus, the use of Gaussian functions in the PSF is not sufficiently accurate to best describe an absorbed energy distribution of this type. As already indicated, the object of the invention is to replace at least one of the Gaussian functions of the PSF by another function so as to obtain a better fit with the distribution curves of of the type of those represented on FIG. 1 which correspond to the reference model.

Figure 2:
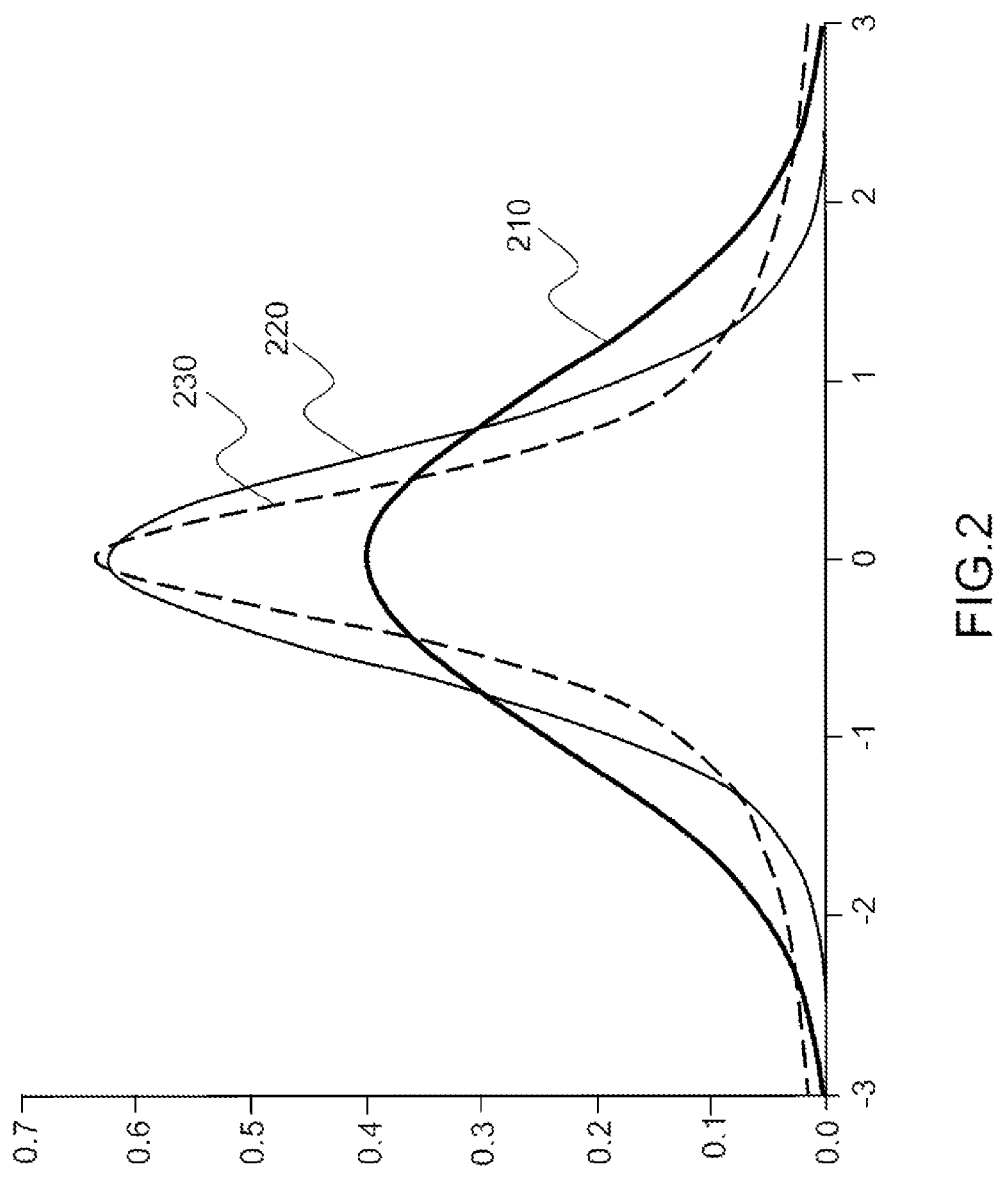
FIG. 2 represents a Gaussian function, a Lorentz function and a Voigt function.

FIG. 2 represents a Gaussian function, a Lorentz function and a Voigt function.

The inventors have shown that Voigt type functions, which are the convolution product of a Gaussian function and of a Lorentzian function or sufficiently accurate approximations of these functions, improve the fit with the reference model. A Voigt function of a distance $\xi$ to the center of the beam $\xi_c$ is calculated via the convolution formula:

$$y(x) = \int_{-\infty}^{+\infty} \left( e^{\left(\frac{(x-t)-x_c}{a}\right)^2} \left( \frac{1}{1 + \left(\frac{t-x_c}{b}\right)^2} \right) \right) dt$$

in which a is the standard deviation of the Gauss function and b is the half-width at mid-height of the Lorenz function, the height being the value of said function at $x_c$ i.e. $\frac{1}{\pi}$.

The three functions are represented in the figure: a Gaussian function, by the curve 210, a Lorentzian function by the curve 220 and a Voigt function by the curve 230.

The Voigt function not being easy to calculate analytically, use is often made of an approximation by a Pearson VII function which is expressed by the formula:

$$y = \frac{1}{\left[1 + \left(\frac{2(\xi - \xi_c)\sqrt{2^{\frac{1}{M}-1}}}{w}\right)^2\right]^M}$$

in which M is the shape parameter or Pearson width and w a distance giving the width at mid-height FWHM (Full Width at Half Maximum) of the Pearson peak. When M<<1, the shape of the curve approximates a Lorentz curve. When M>>10, the shape of the curve approximates a Gauss curve.

According to the invention, for best possible approximation of a radiation distribution corresponding to layers of specific materials having a given thickness, it is possible to linearly combine Voigt functions, Pearson VII functions, as well as Gaussians with either Voigt functions or Pearson VII functions, the coefficients of the linear combination and the parameters of said functions being judiciously chosen to optimize the fit with the reference model. The fit is measured by the residual mean square error. To calculate the values of the parameters which optimize the fit with the reference model it is possible to use procedures for local optimization for example those based on the Levenberg-Marquardt algorithm or the simplex algorithm or procedures for more global optimization, for example kriging or procedures based on genetic algorithms.

In the case where the share of the backscattering is significant, notably for the etching of masks under extreme ultraviolet or the etching of structured substrates (locally comprising differences of compositions, for example zones of oxides adjacent to semi-conductor zones), it will be conceivable to combine the method of the present invention with that described in French patent application No.11/

57338 filed notably by one of the applicants of the present application. According to this invention, use is made of a PSF which is not centered at the center of the beam.

Figure 3A:
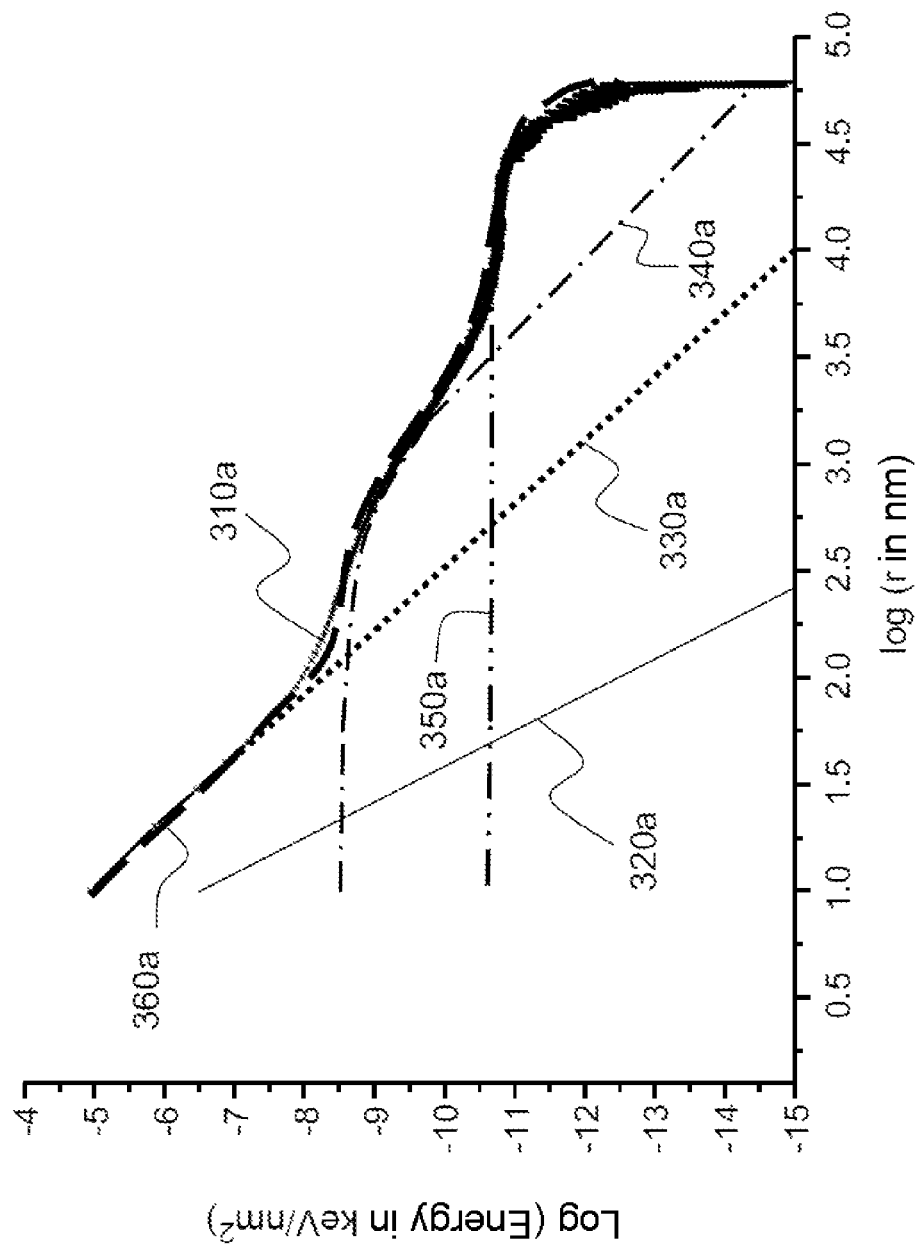
FIGS. 3a and 3b represent the distribution of energy absorbed by a resin or by a mask insulated under extreme UV according to one embodiment of the invention.
Figure 3B:
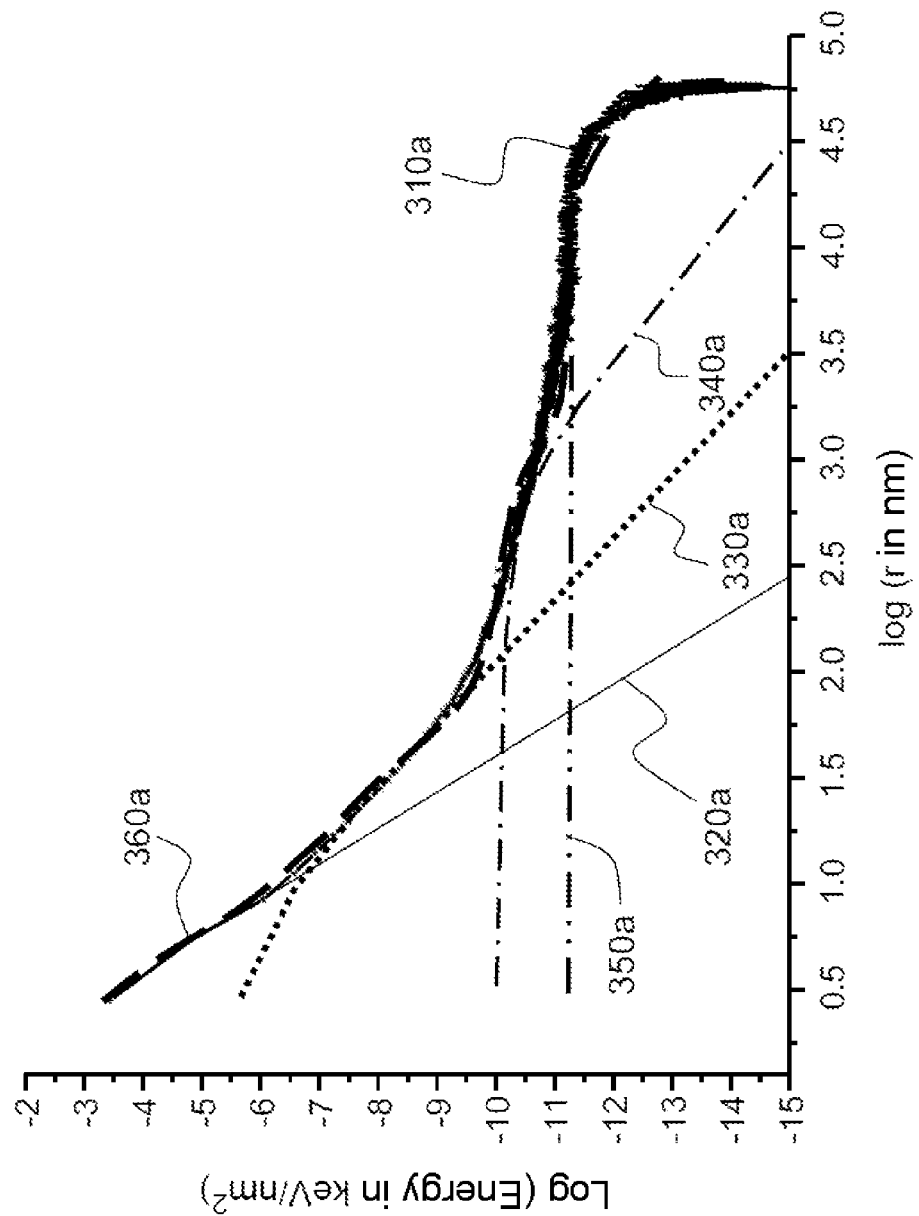

FIGS. 3a and 3b represent the distribution of energy absorbed by a resin or by a mask insulated under extreme UV according to one embodiment of the invention.

In FIG. 3a is represented, purely by way of non-limiting illustration of the generality of the invention, an embodiment of the invention in which a mask adapted for this use (that is to say consisting for example of a glass support covered with a chromium or tantalum absorber) is subjected to a radiation. The reference model given by curve 310a is determined by the CASINO simulation software using the ESELPA database which accurately gives the collision cross sections for electrons colliding with matter in a wide energy range. Four Pearson VII functions are combined to produce the PSF 360a:

- A first Pearson1 function, represented by curve 320a, is a Pearson VII function whose parameters M and w are fixed respectively at 3 and 2.2 nm;
- A second Pearson2 function, represented by curve 330a, is a Pearson VII function whose parameters M and w are fixed respectively at 1.7 and 8 nm;
- A third Pearson3 function, represented by curve 340a, is a Pearson VII function whose parameters M and w are fixed respectively at 1.5 and 1200 nm;
- A fourth Pearson4 function, represented by curve 350a, is a Pearson VII function whose parameters M and w are fixed respectively at 50 and 300 microns.

The PSF is the linear combination of the four Pearson VII functions of formula:

$$PSF = Pearson1 \times A1 + Pearson2 \times A2 + Pearson3 \times A3 + Pearson4 \times A4$$

In which the coefficients of the combination have the following values:

A1 such that $\log(A1) = -1.25$;
A2 such that $\log(A2) = -3.7$;
A3 such that $\log(A3) = -8.5$;
A4 such that $\log(A4) = -10$.

In FIG. 3b is represented, purely by way of non-limiting illustration of the generality of the invention, an embodiment of the invention in which a substrate covered with a resin, for example PMMA, receives a radiation. The representations and notation are the same as those of FIG. 3a. The Pearson VII functions which are used are identical to those of FIG. 3a. The only change is the coefficients Ai of the linear combination. They have in this case the following values:

A1 such that $\log(A1) = -1.25$;
A2 such that $\log(A2) = -5.4$;
A3 such that $\log(A3) = -10$;
A4 such that $\log(A4) = -11.2$.

These values make it possible to obtain a better fit with the reference model.

FIGS. 4a to 4f represent the distribution of energy absorbed in various scenarios of use of the invention.

In all of FIGS. 4a to 4f, the radiation curve for the reference model 410a is compared with the PSF calculated according to the method of the invention 420a for the sum of four Voigt functions and with those calculated according to the conventional methodology 430a consisting in using a sum of four Gaussian functions.

In FIGS. 4a to 4e, the radiation is emitted by a small beam (of 2 nm in the illustrative example of these figures).

Figure 4A:
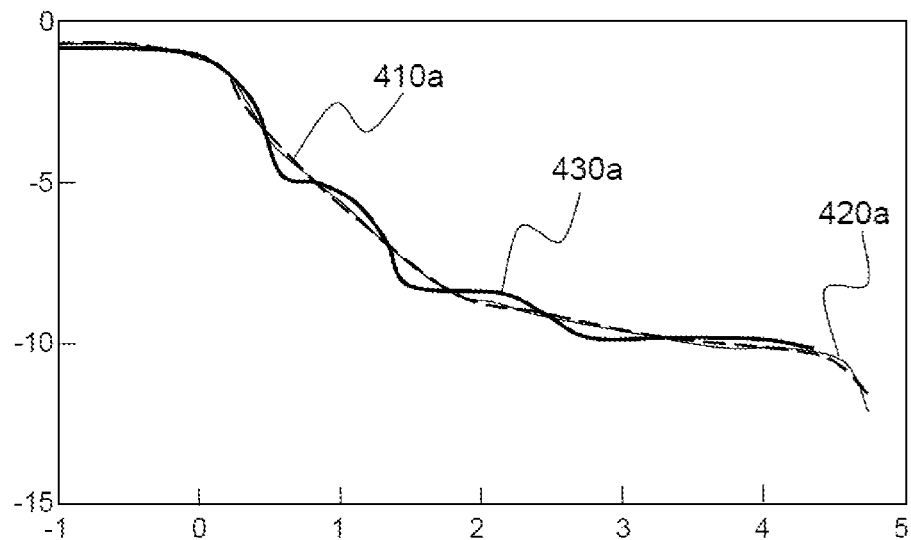
FIGS. 4a to 4f represent the distribution of energy absorbed in various scenarios of use of the invention.

In FIG. 4a is illustrated a case in which the target is a 100-nm PMMA stack on silicon substrate, the radiation having an energy of 100 keV.

Figure 4B:
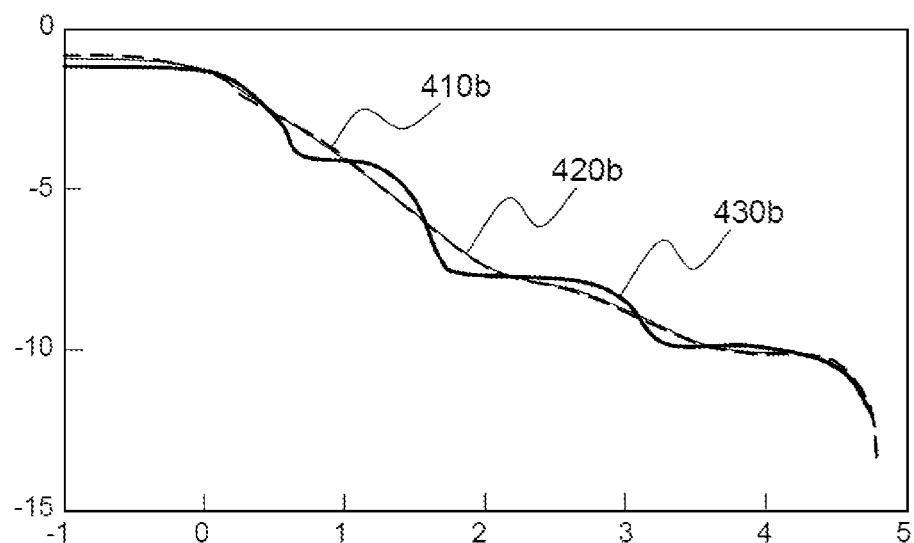

In FIG. 4b is illustrated a case in which the target is an EUV (extreme UV) stack, the radiation having an energy of 100 keV.

Figure 4C:
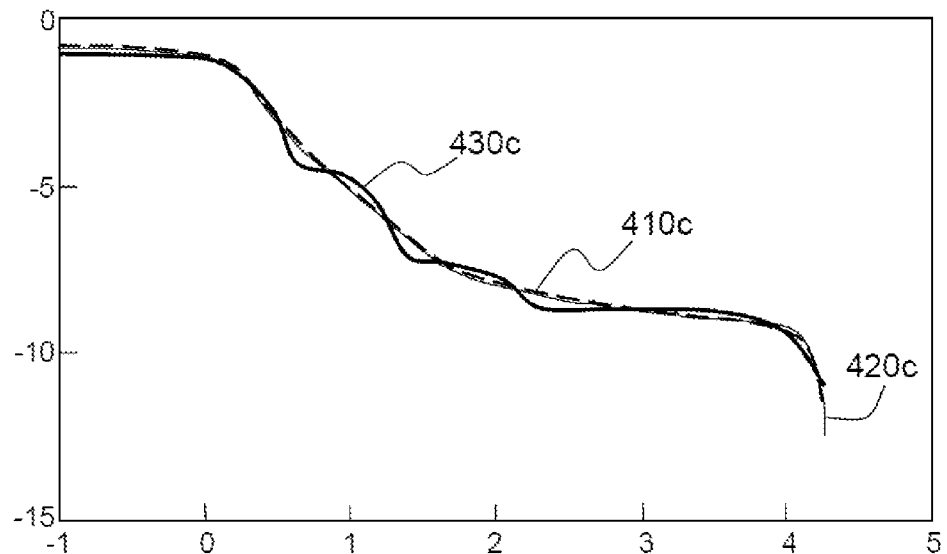

In FIG. 4c is illustrated a case in which the target is a 100-nm PMMA stack on silicon substrate, the radiation having an energy of 50 keV.

Figure 4D:
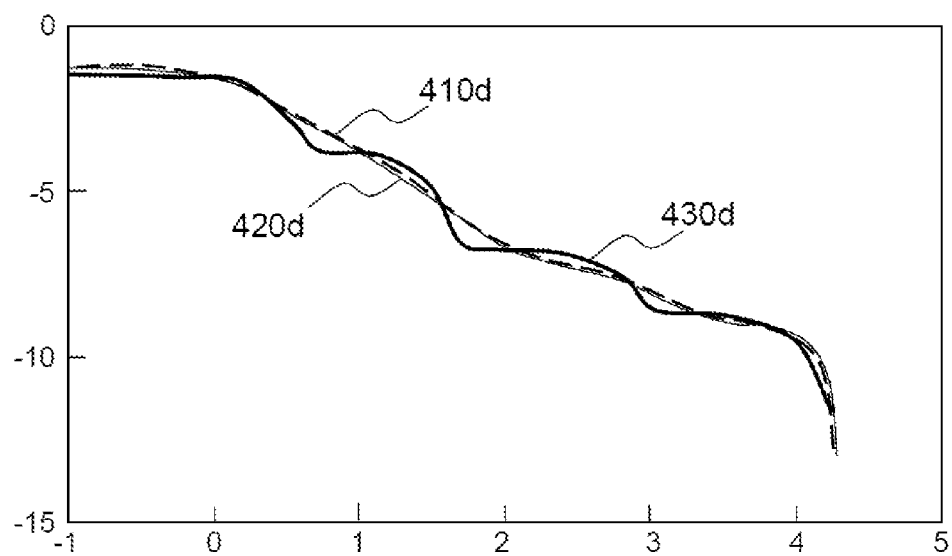

In FIG. 4d is illustrated a case in which the target is an EUV (extreme UV) stack, the radiation having an energy of 50 keV.

Figure 4E:
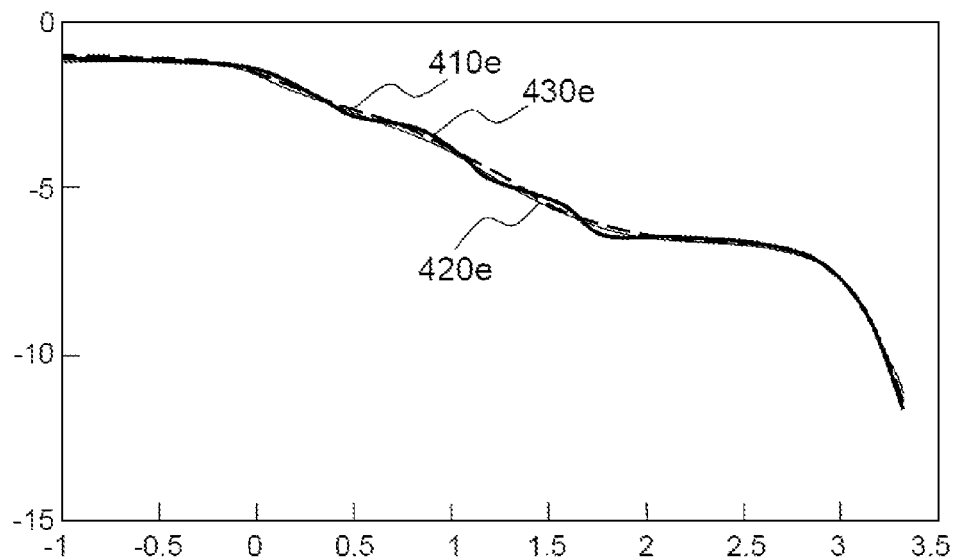

In FIG. 4e is illustrated a case in which the target is a 100-nm PMMA stack on silicon substrate, the radiation having an energy of 10 keV.

Figure 4F:
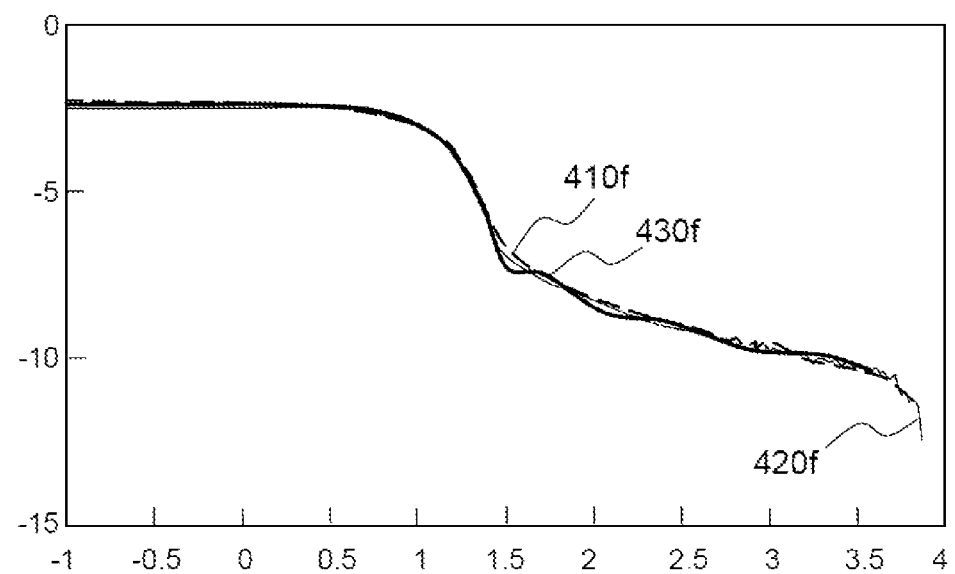

In FIG. 4f is illustrated a case in which the target is a 100-nm PMMA stack on silicon substrate, the radiation consisting of a broad beam (30 nm) having an energy of 100 keV.

From the various curves we note that the fit between the PSF of the invention and the reference model is particularly good in all the configurations which are represented. The quality of the fit of the method of the invention does not allow to differentiate the reference curves 410x from the curves 420x representative of the invention whereas sharp deviations are observed with the curves 430x representative of the prior art and using Gaussian functions.

The method of the invention can, however, also be implemented in other usage conditions.

According to the invention, the Voigt functions or the Pearson VII functions are chosen in such a way that the resulting distribution is centered or non-centered with respect to the center of the electron beam. An off-centering of certain peaks is conceivable for conditions where the backscatter becomes predominant. In a favored manner, the center of the distribution is adjusted to the backward scattering peak (backscatter). This choice is particularly advantageous when the backward scattering effect is particularly significant, notably when layers of tantalum or of nitrogen-doped tantalum are implanted on the substrate as is the case in applications to the fabrication of extreme UV masks. Indeed, these layers of heavy materials cause very appreciable backward scattering. It is indeed noted both experimentally and by Monte-Carlo simulation that said peak is off-centered with respect to the center of the electron beam. There may be several scattering peaks. In this case, it will advantageously be chosen to combine as many Voigt or Pearson VII functions as scattering peaks. On the curve representing the absorbed energy distribution, the scattering peaks can be manifested by a change of slope at the level of this curve. It will thus be possible to choose advantageously to combine as many Voigt or Pearson VII functions as observable change of slope. It will if appropriate be possible to choose to center at least one function or each on each peak even if this is not always necessary to improve the fit.

To implement the method of the invention in its applications to electron lithography by direct projection on wafers or by mask etching, it is possible to use for example a machine of the type SB 3054 from the company VISTEC™. Dose modulation may for example be performed, according to the invention, by modifying dose modulation software, for example the PROXECCO™ software distributed by the company Synopsis™ or the Inscal™ software from the company Aselta Nanographics™ to replace the PSF of the backscattering of the prior art by the PSF of the backscattering described hereinabove. For the forward scattering PSF, it will be possible to use as in the prior art a centered Gaussian or any other type of bell curve centered on the center of the beam.

Dose modulation is performed by convolving the PSF (PSF of the forward scattering and PSF of the backscattering) with the geometry of the pattern to be etched. The software can also be advantageously modified to carry out combined optimization of the dose modulation and of the geometry of the pattern to be etched, according to a method such as that described in international application PCT/EP2011/05583 licensed to one of the applicants of the present patent application.

The method of the invention and the computer program for implementing it can also be used to optimize the PSF of scanning, field-effect or tunnel-effect electron microscopy systems which can be used in imaging or to carry out the inspection of wafers or masks. They can also be adapted for carrying out a simulation of one or more steps of an electron lithography method.

The examples described hereinabove are therefore given by way of illustration of certain embodiments of the invention. They do not in any way limit the field of the invention which is defined by the claims which follow.

The invention claimed is:

1. A method for projecting an electron beam onto a wafer or a mask, comprising:
   a step of correcting, at an electron beam lithography machine, scattering effects in said electron beam projectable onto a wafer or a mask, said step comprising a sub-step of calculating a point spread function modeling an interaction of the electron beam with a resin on the wafer or the mask over an area of said wafer or said mask, wherein said point spread function is a linear combination of functions chosen from a group comprising at least one Voigt function and a function approximating a Voigt function, said modeling with the point spread function taking into account forward scattering effects and backward scattering effects of said electron beam, and being determined by a best fit calculation over the area of the interaction,
   wherein the sub-step of calculating the point spread function comprises a sub-step of selecting parameters of said functions which are included in the linear combination, said parameters including a distance to the center of the electron beam and shape parameters, and coefficients of said linear combination, all coefficients in the linear combination including the at least one Voigt function and the function approximating the Voigt function are positive for the backward scattering effects; and
   wherein the linear combination forming the point spread function is a combination of as many functions as backward scattering peaks of the electron beam;
   a step of producing a file of data arranged to drive a projection of said electron beam onto the wafer or the mask based on said correcting.

2. The projection method of claim 1, wherein said function approximating a Voigt function is a Pearson VII function.

3. The projection method of claim 1, wherein said linear combination of functions further comprises at least one Gaussian function.

4. The projection method of claim 1, wherein said at least one Voigt function has an extremum which is not located at a center of the electron beam.

5. The projection method of claim 4, wherein said at least one function approximating the Voigt function has an extremum which is located on the backscattering peak of the electron beam.

6. The projection method of claim 1, further comprising:
   a step of retrieving the file of data arranged to drive projection and a step of driving projection of said electron beam from said retrieved data.

7. The projection method of claim 1, further comprising:
   a step of projecting said electron beam onto the wafer or the mask based on said stored file.

8. The projection method of claim 1, wherein said sub-step of selecting including an execution of an optimization function of a fit of the point spread function with a set of experimental results or with a representation of a Monte-Carlo simulation of the scattering effects of the electron beam on a target on the wafer or the mask.

9. A non-transitory computer readable medium including a computer program comprising program code instructions configured to be executed by a computer, when the computer program is executed on a computer, said computer program comprising a module for simulating and/or correcting scattering effects in an electron beam, said module comprising a sub-module for calculating a point spread function, the computer configured to implement:
   a step of correcting, at an electron beam lithography machine, scattering effects in said electron beam projectable onto a wafer or a mask, said step comprising a sub-step of calculating a point spread function modeling an interaction of the electron beam with a resin on the wafer or the mask over an area of said wafer or said mask, wherein said point spread function is a linear combination of functions chosen from a group comprising at least one Voigt function and a function approximating a Voigt function, said modeling with the point spread function taking into account forward scattering effects and backward scattering effects of said electron beam, and being determined by a best fit calculation over the area of the interaction,
   wherein the sub-step of calculating the point spread function comprises a sub-step of selecting parameters of said functions which are included in the linear combination, said parameters including a distance to the center of the electron beam and shape parameters, and coefficients of said linear combination, said coefficients in the linear combination including the at least one Voigt function and the function approximating the Voigt function are positive for the backward scattering effects, and
   wherein the linear combination forming the point spread function is a combination of as many functions as backward scattering peaks of the electron beam;
   a step of producing a file of data on the computer, which is configured to drive a projection of said electron beam onto the wafer or the mask based on said correcting.

10. The non-transitory computer readable medium including the computer program of claim 9, wherein said function approximating a Voigt function is a Pearson VII function.

11. The non-transitory computer readable medium including the computer program of claim 9, wherein said linear combination of functions further comprises at least one Gaussian function.

12. The non-transitory computer readable medium including the computer program of claim 9, wherein said sub-step of selecting including an execution of an optimization function of a fit of the point spread function with a set of experimental results or with a representation of a Monte- Carlo simulation of the scattering effects of the electron beam on a target on the wafer or the mask.

13. An electron lithography system comprising a module for projecting said electron beam onto the wafer or the mask and the computer for executing the computer program according to claim 9.

14. A method for projecting an electron beam onto a wafer or a mask, comprising:
a step of correcting, at an electron beam lithography machine, scattering effects in said electron beam projectable onto a wafer or a mask, said step comprising:
a sub-step of calculating a point spread function modeling an interaction of the electron beam with a resin on the wafer or the mask over an area of said wafer or said mask, wherein said point spread function is a linear combination of functions chosen from a group comprising at least one Voigt function and a function approximating a Voigt function, said modeling with the point spread function taking into account forward scattering effects and backward scattering effects of said electron beam, and being determined by a best fit calculation over the area of the interaction,
wherein the sub-step of calculating the point spread function comprises a sub-step of selecting parameters of said functions which are included in the linear combination, said parameters including a distance to the center of the electron beam and shape parameters, and coefficients of said linear combination, all said coefficients in the linear combination including the at least one Voigt function and the function approximating the Voigt function are positive for the backward scattering effects, said selecting including an execution of an optimization function of a fit of the point spread function with a set of experimental results or with a representation of a Monte-Carlo simulation of the scattering effects of the electron beam on a target on the wafer or the mask,
a sub-step of adjusting a center of the point spread function based upon a center of a backscattering of the electron beam from the wafer or the mask such that the linear combination of functions includes a same number of the Voigt function or the function approximating the Voigt function as a number of backward scattering peaks; and
a step of producing a file of data arranged to drive a projection of said electron beam onto the wafer or the mask based on said correcting.

* * * * *